US 6,715,114 B2

(12) United States Patent
Koike

(10) Patent No.: US 6,715,114 B2
(45) Date of Patent: *Mar. 30, 2004

(54) TEST METHOD AND APPARATUS FOR SEMICONDUCTOR DEVICE

(75) Inventor: Naoyuki Koike, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/342,051

(22) Filed: Jun. 29, 1999

(65) Prior Publication Data

US 2002/0199146 A1 Dec. 26, 2002

(30) Foreign Application Priority Data

Jun. 10, 1999 (JP) ............................ 11-163993

(51) Int. Cl.$^7$ ............................ G11C 29/00; G11C 7/00
(52) U.S. Cl. ........................... 714/718; 365/201
(58) Field of Search .................... 714/718, 724; 365/200, 201

(56) References Cited

U.S. PATENT DOCUMENTS

| | | | | |
|---|---|---|---|---|
| 4,314,763 A | * | 2/1982 | Steigmeier et al. | 356/237.2 |
| 4,939,694 A | * | 7/1990 | Eaton et al. | 365/200 |
| 5,315,130 A | * | 5/1994 | Hively et al. | 257/48 |
| 5,457,400 A | * | 10/1995 | Ahmad et al. | 324/763 |
| 5,483,175 A | * | 1/1996 | Ahmad et al. | 438/18 |
| 5,635,850 A | * | 6/1997 | Ogura | 324/760 |
| 5,754,556 A | * | 5/1998 | Ramseyer et al. | 714/711 |
| 5,768,290 A | * | 6/1998 | Akamatsu | 714/732 |
| 5,926,423 A | * | 7/1999 | Jeong | 365/201 |

(List continued on next page.)

FOREIGN PATENT DOCUMENTS

| | | | | |
|---|---|---|---|---|
| JP | 04066883 A | * | 3/1992 | ........... G01R/31/26 |
| JP | 7-135243 | | 5/1995 | |
| JP | 8-7593 | | 1/1996 | |
| JP | 08170977 A | * | 7/1996 | ........... G01R/31/28 |
| JP | 10-199943 | | 7/1998 | |

OTHER PUBLICATIONS

Gralian, D.; Next generation burn–in development; IEEE Transactions on [see also Components, Hybrids, and Manufacturing Technology, IEEE Transactions on] Components, Packaging, and Manufacturing Technology, Part B: Advanced Packaging, vol: 17 Issue: 2.*

Furuyama, T.; Kushiyama, N.; Noji, H.; Kataoka, M.; Yoshida, T.; Doi, S.; Ezawa, M. ; and Watanabe, T. ; Wafer burn–in (WBI) technology for RAM's; Technical Digest International Electron Devices Meeting 1993; Page(s): 639–642.*

Sut–Mai Tang ; New burn–in methodology based on IC attributes, family IC burn–in data, and failure mechanism analysis; Annual Proceedings International Symposium on Product Quality and Integrity Reliability and Maintainability Symposium, 1996; Page(s):185.*

Sut–Mui Tang, New burn–in methodology based on IC attributes, family IC burn–in data, and failure mechanism analysis, Reliability and Maintainability Symposium, 1996 Proceedings. International Symposium on Product Quality and Integrity., Annual, 1996 Page.*

*Primary Examiner*—Albert Decady
*Assistant Examiner*—Joseph D. Torres
(74) *Attorney, Agent, or Firm*—Westerman, Hattori, Daniels & Adrian, LLP

(57) ABSTRACT

A semiconductor device testing apparatus includes a first part which repeatedly performs a wafer-level burn-in to chips formed on a wafer, and a second part which detects a progress of occurrence of faulty cells in each of the chips.

18 Claims, 9 Drawing Sheets

U.S. PATENT DOCUMENTS

| | | | |
|---|---|---|---|
| 6,026,038 A * | 2/2000 | Cho et al. | 365/201 |
| 6,055,199 A * | 4/2000 | Hamade et al. | 365/201 |
| 6,072,574 A * | 6/2000 | Zeimantz | 356/237.4 |
| 6,122,760 A * | 9/2000 | Grosch et al. | 714/724 |
| 6,233,184 B1 * | 5/2001 | Barth et al. | 365/201 |
| 6,255,208 B1 * | 7/2001 | Bernier et al. | 438/613 |
| 6,265,232 B1 * | 7/2001 | Simmons | 438/14 |
| 6,266,286 B1 * | 7/2001 | Cho et al. | 365/201 |
| 6,367,042 B1 * | 4/2002 | Phan et al. | 714/733 |

* cited by examiner

F I G. 9
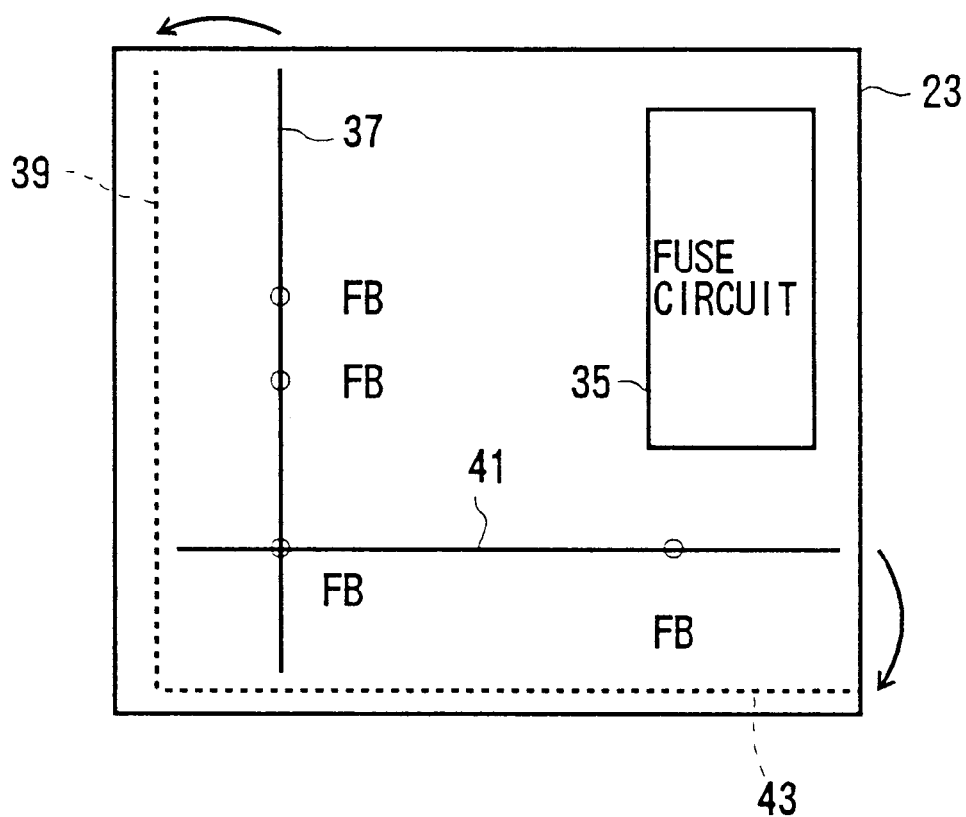

TEST METHOD AND APPARATUS FOR SEMICONDUCTOR DEVICE

BACKGROUND OF THE INVENTION

1. Field of the Invention

The present invention relates to a method and apparatus for testing semiconductor devices such as semiconductor memory devices, and semiconductor devices produced by such a testing method or apparatus.

2. Description of the Related Art

Recent semiconductor memory devices have an increased memory capacity, which increases the time and cost necessary for testing the semiconductor memory devices.

The fraction of faulty chips can be obtained by a monitor test performed during the burn-in process after packaging and/or a final test after the burn-in process. If the fault rate of each lot calculated based on the fraction of faulty chips does not reach a given reference value, the burn-in process, which considerably increases the cost of testing, will further be performed.

In such a case, the additional burn-in increases the cost of testing the semiconductor devices. It may be required to additionally or newly invest in the facility for testing the semiconductor devices. Thus, the final cost of semiconductor devices is increased in order to withdraw the additional cost and the investment.

Conventionally, only faulty bits on a wafer are found under the normal operating condition during the test performed before packaging and are replaced by redundant bits. The burn-in is carried out at the stage of the final test performed after packaging and it is only determined whether each packaged chip is faulty. The faulty packaged chips are thus discarded.

SUMMARY OF THE INVENTION

It is an object of the present invention to efficiently and effectively test the semiconductor devices and to thus reduce the production cost.

The above object of the present invention is achieved by a semiconductor device testing apparatus comprising: a first part which repeatedly performs a wafer-level burn-in to chips formed on a wafer; and a second part which detects a progress of occurrence of faulty cells in each of the chips.

The above object of the present invention is also achieved by a method of testing a semiconductor device comprising the steps of: (a) repeatedly performing a wafer-level burn-in to chips formed on a wafer; and (b) detecting a progress of occurrence of faulty cells in each of the chips.

The above object of the present invention is also achieved by a semiconductor device comprising: a chip which is one of chips formed on a wafer and subjected to a wafer-level burn-in by a predetermined number of times; and a redundant circuit which replaces the faulty cells with redundant cells in accordance with a progress of occurrence of the faulty cells.

BRIEF DESCRIPTION OF THE DRAWINGS

Other objects, features and advantages of the present invention will become more apparent from the following detailed description when read in conjunction with the accompanying drawings, in which:

FIG. 9 is a schematic diagram of a semiconductor device in which faulty cells can be replaced by redundant cells.

DESCRIPTION OF THE PREFERRED EMBODIMENTS

The test method of the present invention monitors the time-based occurrence of faulty bits during the burn-in process before packaging. It is hence found how faulty bits occur by stress applied to the chips. In other words, the progress of occurrence of faulty bits can be detected. For example, it becomes possible to determine whether faulty bits occur at one time or different times. The progress of occurrence of faulty bits can be detected before packaging, and it is thus possible to replace faulty bits by redundant bits. Further, it is possible to determine the optimal burn-in by referring to the progress of occurrence of detective bits. Furthermore, it is possible to find a problem resulting from the production process by referring to the progress of occurrence of detective bits.

Figure 1:
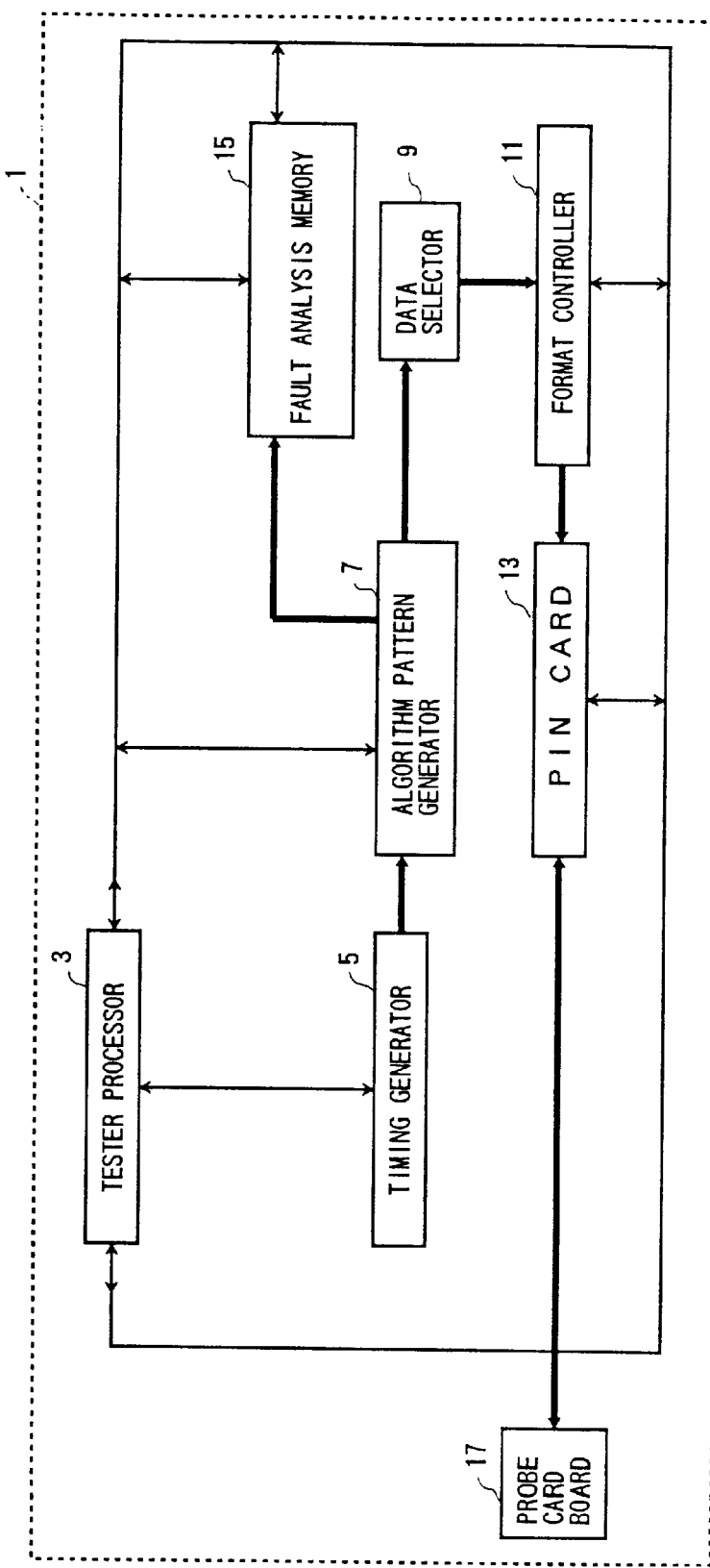
FIG. 1 is a block diagram of a semiconductor device testing apparatus according to an embodiment of the present invention.

FIG. 1 is a block diagram of an overall structure of a semiconductor device testing apparatus according to an embodiment of the present invention. A semiconductor device testing apparatus 1 shown in FIG. 1 includes a tester processor 3, a timing generator 5, an algorithm pattern generator 7, a data selector 9, a format controller 11, a pin card 13, a fault analysis memory 15, and a probe card board 17. The tester processor 3 includes a CPU and a memory part such as a storage disk such as a magnetic hard disk. The timing generator 5 is connected to the tester processor 3. The algorithm pattern generator 7 is connected to the timing generator 5 and the tester processor 3. The data selector 9 is connected to the algorithm pattern generator 7. The format controller 11 is connected to the data selector 9 and the tester processor 3. The pin card 13 is connected to the format controller 11 an the tester processor 3, and includes a driver and comparator. The fault analysis memory 15 is connected to the algorithm pattern generator 7 and the tester processor 3. A device to be tested is attached to the probe card board 17, which is connected to the pin card 13. The fault analysis memory 15 may be replaced by a fault counter, which can provide the same function as that of the fault analysis memory 15.

A description will now be given of an operation of-the semiconductor device testing apparatus 1. A test program is loaded to the tester processor 3, more particularly, the CPU provided in the tester processor 3. Then, the tester processor 3 supplies the timing generator 5 with an instruction signal for supplying a predetermined test signal to the probe card board 17.

The algorithm pattern generator 7 and the data selector 9 determines when the above test signal should be supplied to the probe card board 17 in accordance with the signal supplied from the timing generator 5. The format controller 11 determines measurement pins via which the test signal are supplied on the basis of the signal supplied from the data selector 9.

The pin card 13, more particularly, the built-in driver supplies the test signal to the probe card board 17 on the basis of the signal supplied from the format controller 11.

The probe card board 17 applies the test signal to the device to be tested (testee device), and supplies output data obtained from the device to the pin card 13 (more particularly, the built-in comparator). Then, the comparator of the probe card board 17 compares the output data obtained from the testee device with an expected value output by the algorithm pattern generator 7. The expected value is a logic level of the test signal supplied to each memory cell of the testee device, and is either "1" or "0".

If the output data does not coincide with the expected value, the tester processor 3 determines that the corresponding memory cell is faulty. In the fault analysis memory 15, an initial value "0" of faulty bit information is stored for each address corresponding to a respective memory cell. The faulty bit information stored in the address of the memory cell which is determined as being faulty is changed from "0" to "1".

When a fault counter is substituted for the fault analysis memory 15, the fault counter counts the number of the addresses of faulty memory cells from zero. In this case, the addresses of the faulty memory cells or bits cannot be obtained, but the number of faulty memory cells or bits can be obtained.

After the above monitor operation is finished, the tester processor 3 reads the addresses of the faulty memory cells or the number of faulty memory cells from the fault analysis memory 15. The faulty bit information read from the fault analysis memory 15 is written in the disk of the tester processor 3. Simultaneously, the number of times that the monitor test has been repeated obtained together with the faulty bit information is written into the tester processor 3.

A chip which is the subject of the additional burn-in which is carried out at the wafer level is selected by the format controller 11 while the faulty bit information on the selected chip is read from the tester processor 3. Then, only the selected chip is supplied, from the pin card 13, with test signal for performing the additional burn-in.

Figure 2:
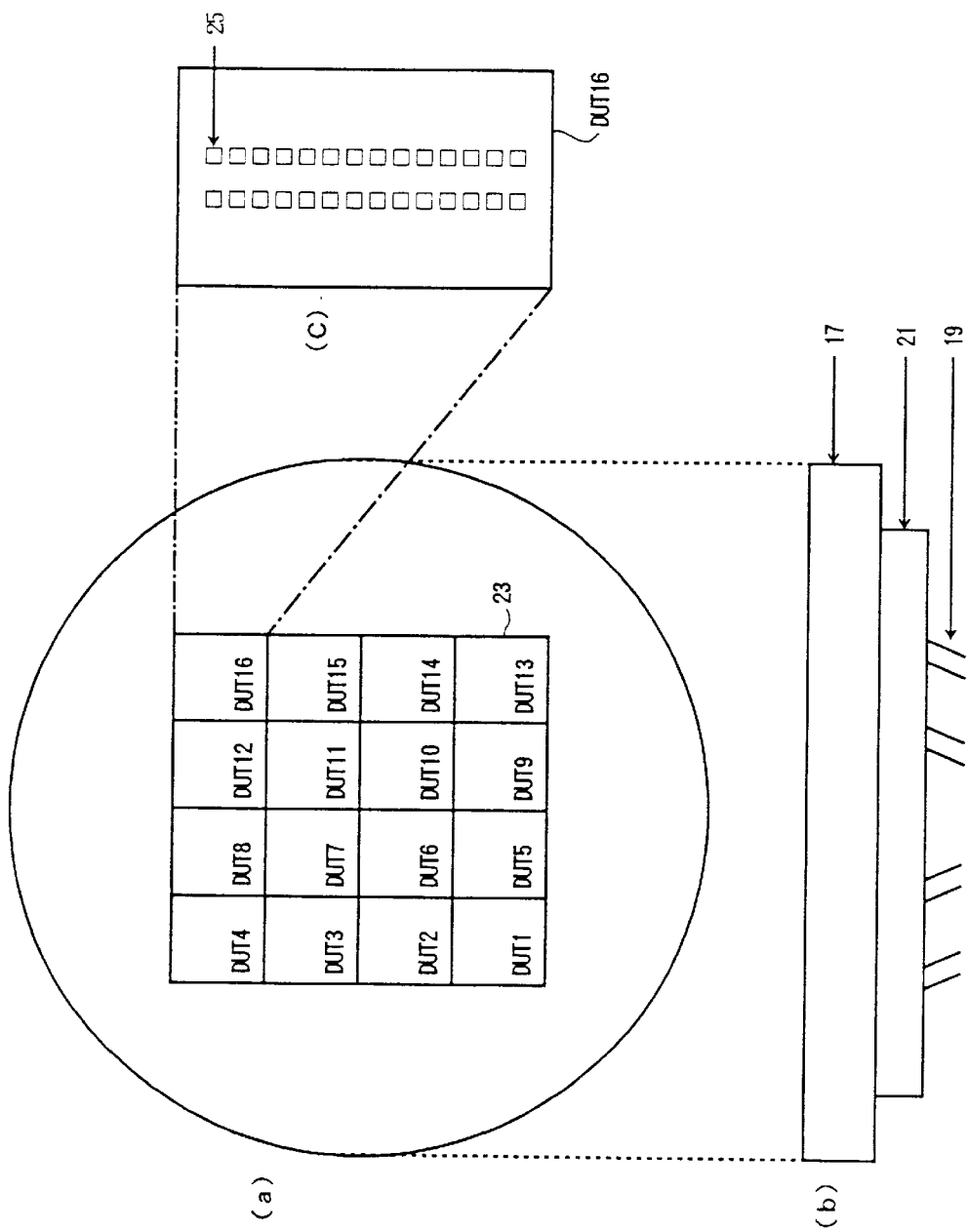
FIG. 2 is a schematic diagram showing that a device to be tested is placed on a probe card board shown in FIG. 1.

FIG. 2 illustrates that a device 23 to be tested is loaded to the probe card board 17. As shown in part (a) of FIG. 2, the device 23 includes 16 chips DUT1–DUT16, which are simultaneously tested. The part (a) of FIG. 2 is a plan view of the device 23 placed on the probe card board 17. A part (b) of FIG. 2 is a side view of the probe card board 17. As shown in the part (b) of FIG. 2, the probe card board 17 is supported by a fixing stage 21, and probes 19 are brought into contact with the chips DUT1–DUT16 shown in the part (a) of FIG. 2.

A part (c) of FIG. 2 shows a layout of the chip DUT16 shown in the part (a) of FIG. 2. The chip DUT16 has pads 25 which are arranged in two lines extending in the center portion of the chip. The probes 19 are brought into contact with the pads 25.

Figure 3:
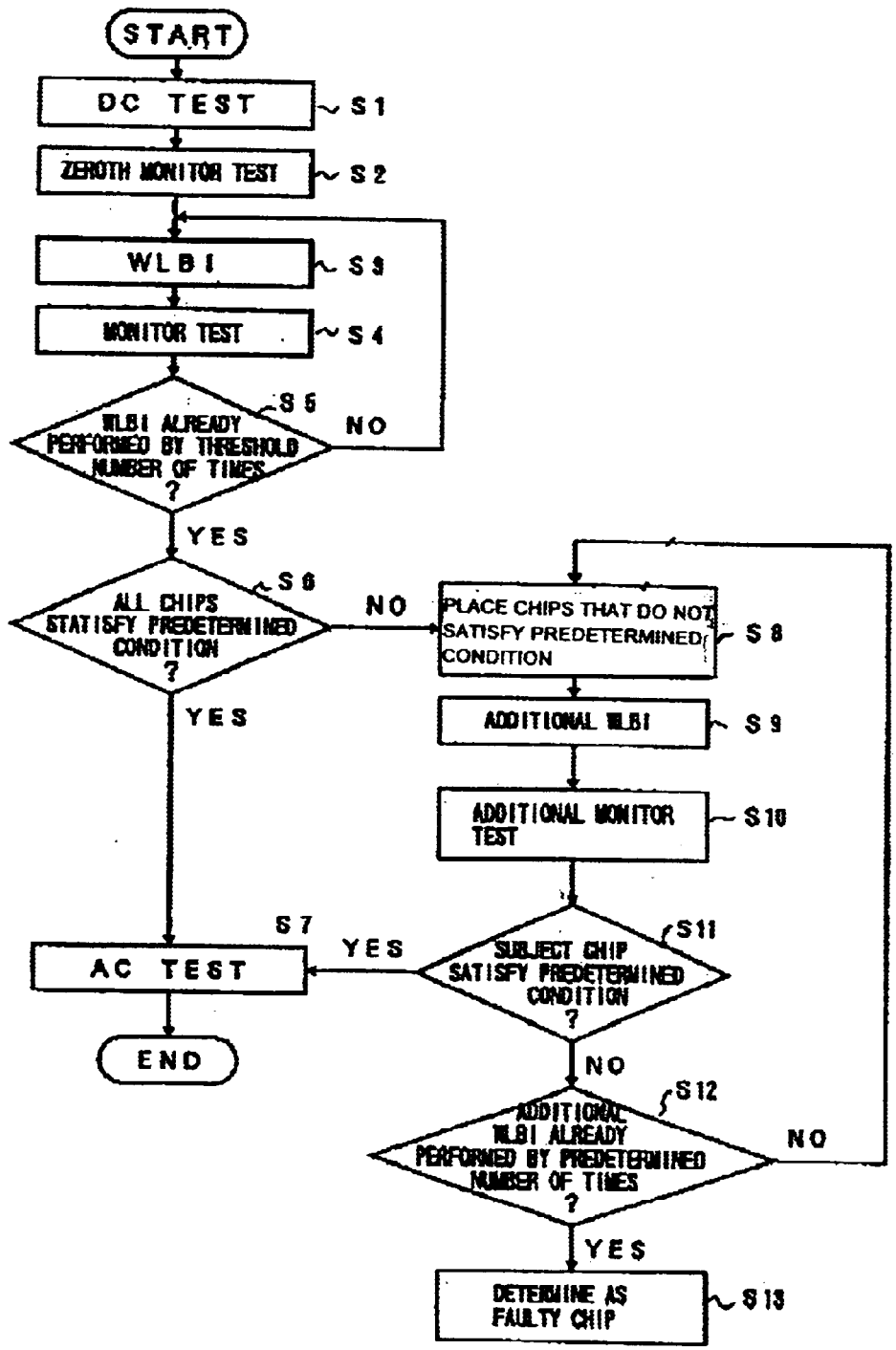
FIG. 3 is a flowchart of a test method executed by the apparatus shown in FIG. 1.

FIG. 3 is a flowchart of a test method, which is carried out by, for example, the semiconductor device testing apparatus as described above. The test method shown in FIG. 3 can simultaneously test a plurality of chips such as the chips DUT1–DUT16.

At step S1, a direct current (DC) test is carried out with respect to the chips DUT1–DUT16. The DC test includes a contact test and a power supply current test. The contact test checks conducting states of each chip. The power supply current test determines whether a normal current flows in the device in a standby state and whether a normal current flows therein in an operation state.

At step S2, the zeroth monitor test is performed, in which faulty bit information (the addresses of faulty bits or the number of faulty bits are stored in the semiconductor device testing apparatus 1, as has been described previously. The faulty bit information thus stored is used as a reference of the quality check which will be performed later.

At step S3, a wafer-level burn-in (WLBI) is carried out in which the device 23 is supplied with a high voltage at a high temperature and thus receives stress.

At step S4, the monitor test is performed by the semiconductor device testing apparatus 1 whereby faulty bit information is obtained. By using the faulty bit information, the progress of occurrence of faulty bits after the wafer-level burn-in can be detected.

At step S5, it is determined, by the tester processor 3, whether the number of times the wafer-level burn-in has been repeatedly carried out reaches a threshold number of times. If the answer of step S5 is negative, the process returns to step S3, and the wafer-level burn-in and the monitor test are carried out again. For example, the threshold number of times corresponds to the given burn-in time in the final test. According to the embodiment of the present invention, the whole burn-in process is divided into n parts where n is an integer. That is, the given burn-in time of the whole burn-in process is divided into n sections, during each of which n sections the divided wafer-level burn-in process part is performed. Thus, the threshold number of times is equal to n. The n sections may have an equal time or different times. For example, the sections located at the initial stage are comparatively short in order to more frequently monitor the progress of occurrence of faulty bits.

At step S6, it is determined whether all the chips simultaneously measured satisfy a predetermined condition by means of the pin card 13. More particularly, the fault rate and the progress of occurrence of faulty bits obtained when the wafer-level burn-in process has been performed by the predetermined number of times satisfy the respective conditions.

If it is determined at step S6 that all the chips simultaneously measured satisfy the predetermined condition, an AC test is carried out at step S7. On the other hand, if it is determined at step S6 that all the chips do not satisfy the predetermined condition, the process proceeds with step S8. At step S8, chips that satisfy the predetermined condition are electrically isolated or disconnected by the pin card 13 and are placed, by the format controller 11, out of the subject of an additional wafer-level burn-in performed at step 59. Then, the remaining chips which do not satisfy the predetermined condition are subjected to the additional wafer-level burn-in of step S9. At step S9, the chips are supplied with a high voltage at a high temperature.

At step S10, an additional monitor test is performed in which information on faulty bits which occur by the additional wafer-level burn-in performed at step S9. At step S11, it is determined whether the chips which are the subject of the additional monitor test of step S10 satisfy the predetermined condition. If it is determined that the chips do not satisfy the predetermined condition, the process proceeds with step S12, at which it is determined whether the additional wafer-level burn-in has been repeated by a predetermined number of times by the tester processor 3.

If it is determined at step S12 that the additional wafer-level burn-in has not yet been repeated by the predetermined number of times, the process returns to step S8, at which the additional wafer-level burn-in is performed. The predetermined number of times that the process should be repeated depends on the device to be tested. On the other hand, if it is determined at step S12 that the additional wafer-level burn-in has been repeated by the predetermined number of times, the tester processor 3 concludes that each chip which is determined not to satisfy the predetermined condition is finally faulty as step S13.

If it is determined at step S11 that the chips which are the subject of the additional monitor test of step S10 satisfy the predetermined condition, the AC test is performed at step S7, at which step the chips which are not the subject of the additional wafer-level burn-in and the chips which are the subject of the additional wafer-level burn-in are simultaneously subjected to the AC test.

Table 1 shows an example of the numbers of faulty bits which have occurred in the chips DUT1–DUT31 which are simultaneously subjected to the test procedure of FIG. 3. The numbers of faulty bits shown in Table 1 are obtained by the monitor test of step S4.

TABLE 1

| | DUT 1 | DUT 2 | DUT 3 | DUT 4 | DUT 5 | DUT 6 | ... | DUT 16 |
|---|---|---|---|---|---|---|---|---|
| N0 | 4 | 1 | 5 | 0 | 1 | 2 | ... | 0 |
| N1 | 4 | 1 | 10 | 0 | 1 | 3 | ... | 0 |
| ... | ... | ... | ... | ... | ... | ... | ... | ... |
| Nn | 4 | 3 | 10 | 0 | 1 | 4 | ... | 0 |

N0: the number of faulty bits that occur during the zeroth monitor test
N1: the number of faulty bits that occur during the first monitor test
Nn: the number of faulty bits that occur during the nth monitor test Table 1 shows that the number of faulty bits which occur in the chip DUT1 by the zeroth through nth monitor tests is 4 and there is no increase in the number of faulty bits. As to chip DUT2, the number of faulty bits which occur by the zeroth and first monitor tests does not increase but is equal to 1. However, the number of faulty bits which occur by the nth monitor test is 3 and there is an increase in the number of faulty bits by an intermediate waver-level burn-in process.

As to the chip DUT3, five faulty bits occur by the zeroth wafer-level burn-in and five faulty bits newly occur by the first wafer-level burn-in. However, no faulty bit occurs by the second through nth wafer-level burn-in processes. As to the chip DUT6, one faulty bit newly occurs each time the wafer-level burn-in process is performed.

Figure 4:
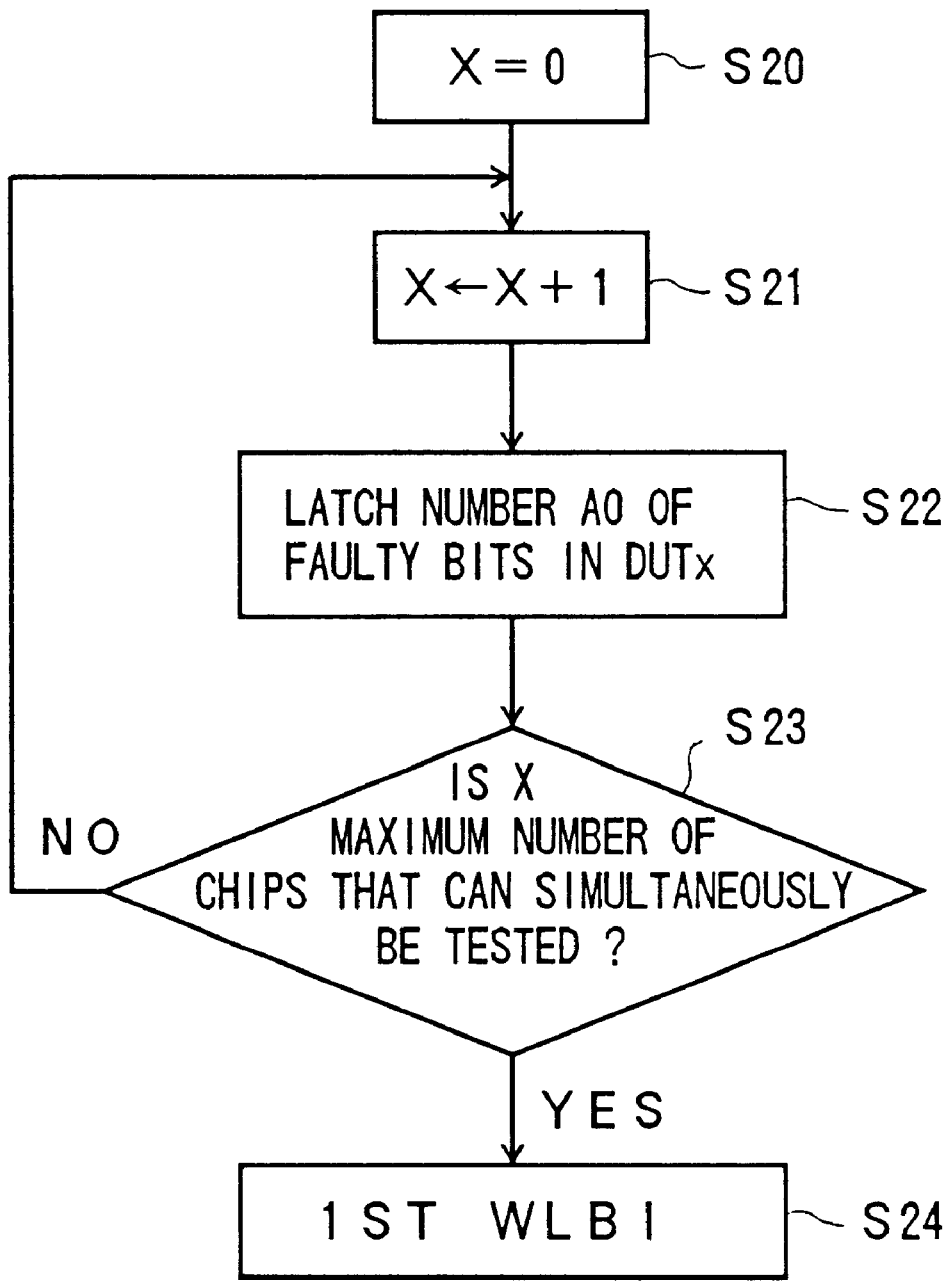
FIG. 4 is a flowchart of obtaining the number of faulty bits for each chip by the zeroth monitor test shown in FIG. 3.

FIG. 4 is a flowchart of a sequence by which the numbers of initial faulty bits of the chips DUT1–DUT16 are stored in the fault analysis memory 15 by the zeroth monitor test shown in FIG. 3. The tester processor 3 inserts 0 into a chip number parameter x (x=0) at step S20, and increments the chip number x by 1 at step S21. At step S22, the number A0 of faulty bits on the chip DUTx of the chip number x set at step S21 is written into the fault analysis memory 15. At step S23, the tester processor 3 determines whether the chip number x is equal to the maximum number of chips which can simultaneously be subjected to the monitor test.

If it is determined at step S23 that the chip number x is not equal to the maximum number of chips, the chip number x is incremented by 1. In contrast, if it is determined at step S23 that the chip number x is equal to the maximum number of chips which can simultaneously be subjected to the monitor test, step S24 is performed so that the first wafer-level burn-in is performed. In the above-mentioned manner, the numbers of initial faulty bits of all the chips DUT (x=1–16) are written into the fault analysis memory 15, and are used as the respective reference values before the wafer-level burn-in is performed. The numbers A0 of initial faulty bits of the chips DUT1–DUT16 may simultaneously be written into the fault analysis memory 15.

Figure 5:
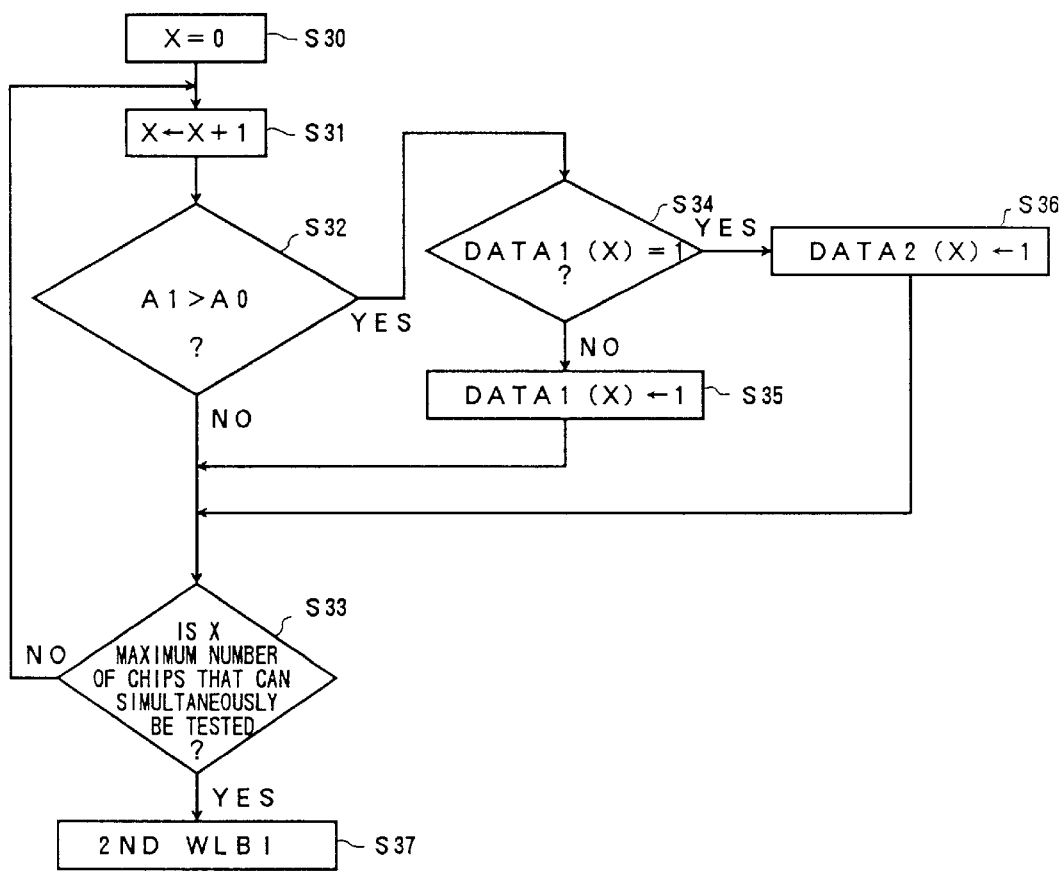
FIG. 5 is a flowchart of a data process performed after the first monitor test shown in FIG. 3.

FIG. 5 is a flowchart of a data process after the first monitor test executed at step S4 shown in FIG. 3. The data process makes it possible to determine whether each chip is degraded by the wafer-level burn-in.

As shown in FIG. 5, 0 is written into the chip number x at step S30 by the tester processor 3. At step S31, the chip number x is incremented by 1. At step S32, the number A1 of faulty bits of the chip DUTx having the chip number x is written into the fault analysis memory 15, and it is determined, by the tester processor 3, whether the number A1 of faulty bits is greater than the number of initial faulty bits.

If the number A1 of faulty bits is greater than the number A0 of faulty bits, the process proceeds with step S34 at which the tester processor 3 determines whether data DATA1(x) is already equal to 1. The flag data DATA1(x) functions as a flag which indicates that a faulty bit occurs in the chip of the chip number x by the wafer-level burn-in.

If it is determined at step S34 that the data DATA1(x) is already equal to 1, the process proceeds with step S36, at which the tester processor 3 sets data DATA2(x) to 1. The data DATA2(x) functions as a flag which indicates that faulty bits occur in the chip of the chip number x more than two times by the wafer-level burn-in. If it is determined, at step S34, that the data DATA1(x) is already equal to 1, the process proceeds with step S35, at which the data DATA1(x) is set to 1.

For example, in the chip DUT1 shown in Table 1, there is no increase in the number of faulty bits even after the wafer-level burn-in has been repeated. Hence, the flag data DATA1(1) and DATA2(1) are both set to 0. In the chip DUT2, the number of faulty bits increases by the nth monitor test. Thus, the flag data DATA2(2) is set to 1. However, there is no increase in the number of faulty bits until the (n−1)th monitor test. Hence, the flag data DATA2(2) is set to 0. That is, although a degradation of memory cells occurs, such a degradation occurs only one time in the nth wafer-level burn-in. In the chip DUT6, the number of faulty bits increases each time the monitor test is performed. Hence, the flag data DATA1(6) and DATA2(6) are both set to 1.

If the result of the step S32 is NO, the process proceeds to step S36 wherein it is judged whether or not the chip number x has exceeded the maximum number of chips that can be simultaneously tested. If the result of the step S36 is YES, the process proceeds to step S37 for the second wafer-level burn in test. If the result of the step S36 is NO, then the process returns to the step S31.

Further, after the step S35, the process proceeds to the step S33. Similarly, after the step S36, the process proceeds to the step S33.

Figure 6:
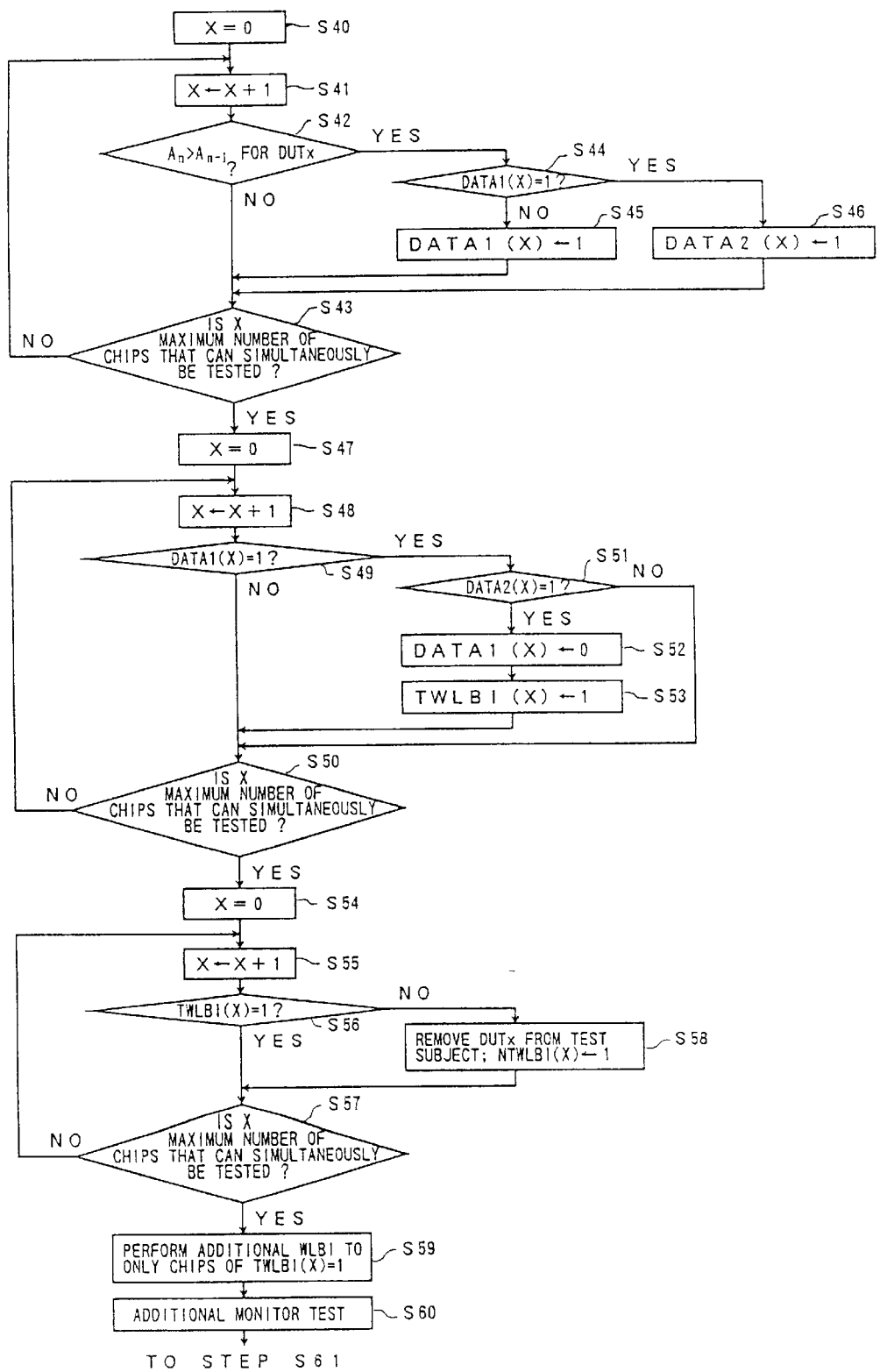
FIG. 6 is a flowchart of a first part of a process performed after a wafer-level burn-in has been carried out by a predetermined number of times.

As shown in FIG. 6, the tester processor 3 sets the chip number x to 0 at step S40, and increments the chip number x by 1 at step S41. At step S42, the tester processor 3 writes the number An of faulty bits of the chip DUTx of the chip number x into the fault analysis memory 15, and determines whether the number An of faulty bits is greater than the number An−1 of faulty bits obtained by the previous ((n−1)th) monitor test.

If it is determined that the number An of faulty bits is greater than the number An−1 of faulty bits, the process proceeds with step S44, at which it is determined that the flag data DATA1 (x) is already equal to 1. If it is determined at step S44 that the flag data DATA1 (x) is already equal to 1, the process proceeds with step S46, at which the flag data DATA2 (x) is set to 1. In contrast, it is determined at step S44 that the flag data DATA1 (x) is not equal to 1, the process proceeds with step S45 at which the flag data DATA1 (x) is set to 1.

At step S43, the tester processor 3 determines whether the chip number x is equal to the maximum number of chips which can simultaneously be subjected to the monitor test. If it is determined that the chip number x is not equal to the maximum number of chips, the process returns to step S41. In contrast, if it is determined that the chip number x is equal to the maximum number of chips, the process proceeds with step S47.

At step S47, the tester processor 3 sets the chip number x to 0, and increments the chip number x by 1. At step S49, the tester processor 3 determines whether the flag data DATA1 (x) is equal to 1. If it is determined that the flag data DATA1(x) is not equal to 1, the process proceeds with step S50. If it is determined that the flag data DATA1(x) is equal to 1, the process proceeds with step S51, at which the flag data DATA2(x) is equal to 1.

If it is determined at step S51 that the flag data DATA2(x) is not equal to 1, the process proceeds with step S50. If it is determined at step S51 that the flag data DATA2(x) is equal to 1, the process proceeds with step S52 at which the flag data DATA1(x) is set to 0. This is a process for monitoring, again, the progress of occurrence of faulty bits by the additional wafer-level burn-in.

At step S53, data TWLBI(x) is set to 1, and the process proceeds with step S50. At step S50, it is determined whether the chip number x is equal to the maximum number of chips which can simultaneously be subjected to the monitor test. If it is determined that the chip number is not equal to the maximum number of chips, the process returns to step S48.

If it is determined at step S50 that the chip number x is equal to the maximum number of chips, the process proceeds with step S54. In the above-mentioned manner, the data TWLBI(x) is set to 1 with respect to each of the chips which should be subjected to the additional wafer-level burn-in.

At step S54, the chip number x is set to 0 by the tester processor 3, and the chip number x is incremented by 1. At step S56, the tester processor 3 determines whether the flag data TWLBI(x) is equal to 1. If the flag data TWLBI(x) is equal to 1, the process proceeds with step S57. If the flag data TWLBI(x) is not equal to 1, the process proceeds with step S58. At step S58, the format controller 11 places the chip DUTx out of the monitor test, and sets data NTWLBI (x) to 1.

At step S57, it is determined whether the chip number x is equal to the maximum number of chips which can simultaneously be subjected to the monitor test. If it is determined that the chip number x is not equal to the maximum number of chips, the process returns to step S55. If it is determined that the chip number is equal to the maximum number of chips, the process proceeds with step S59. At step S59, the additional wafer-level burn-in is carried out with respect to only the chips assigned the flag data TWLBI(x) of 1. Then, the additional monitor test is performed at step S60.

Figure 7:
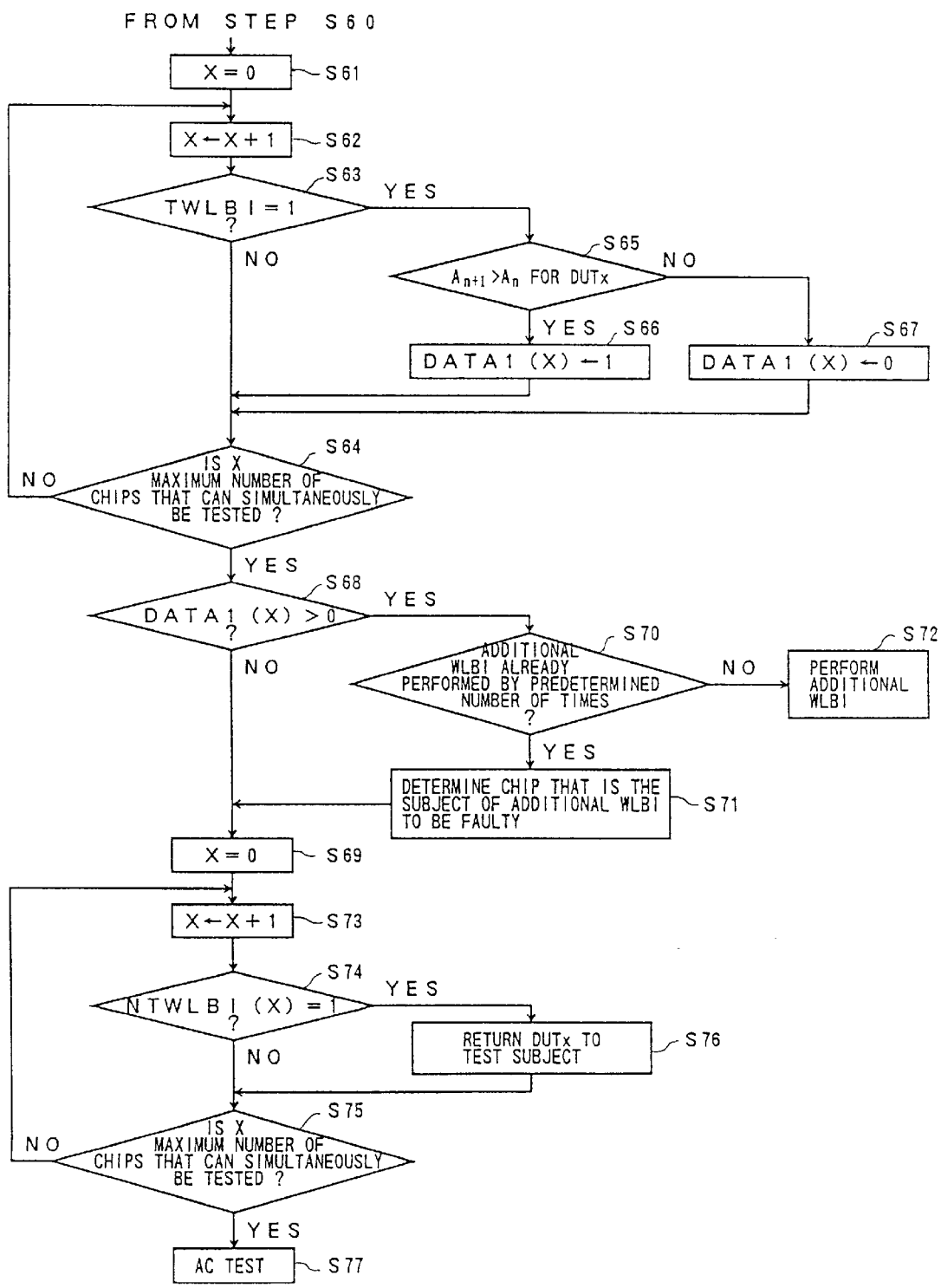
FIG. 7 is a flowchart of a second part of the process performed after the wafer-level burn-in has been carried out by the predetermined number of times.

FIG. 7 is a flowchart which continues to the flowchart of FIG. 6. The chip number x is set to 0 at step S61, and is incremented by 1 at step S62. At step S63, it is determined whether the flag data TWLBI(x) is equal to 1. The process proceeds with step S64 if the flag data TWLBI(x) is not equal to 1, and proceeds with step S65 if the flag data TWLBI(x) is equal to 1.

At step S65, the number An+1 of the chip DUTx is stored in the fault analysis memory 15, and it is determined whether the number An+1 of faulty bits is greater than the number An of faulty bits obtained by the previous monitor test.

If the number An+1 of faulty bits is greater than the number An of faulty bits, the process proceeds with step S66 at which step the flag data DATA1(x) is set to 1. Then, the process proceeds with step S64. On the other hand, if the number An+1 of faulty bits is not greater than the number An of faulty bits, the process proceeds with step S67 at which the flag data ATA1(x) is set to 0. Then, the process proceeds with step S64. That is, at step S65, it is determined whether there is an increase in the number of faulty bits due to the additional wafer-level burn-in of step S59. If the answer of step S65 is YES, the flag data DATA1(x) is set to 1 at step S66.

At step S64, it is determined that the chip number x is equal to the maximum number of chips which can simultaneously be subjected to the monitor test. If it is determined whether the chip number is not equal to the maximum number of chips, the process returns to step S62. If it is determined that the chip number x is equal to the maximum number of chips which can simultaneously be subjected to the monitor test, the process proceeds with step S68.

At step S68, the tester processor 3 determines whether the flag data DATA1 (x) is greater than 0 in order to determine whether there is a chip which should be subjected to the additional wafer-level burn-in. If it is determined that the flag data DATA1 (x) is not greater than 0, the process proceeds with step S69. As to a chip in which the flag data DATA1 (x) is greater than 0, the number of faulty bits tends to still increase. At step S70, it is determined whether or not the additional wafer-level burn in has been repeated by the predetermined number of times. If the result is YES, the process proceeds to step S71 in which the tester processor 3 determines that the chip subjected to the additional wafer-level burn-in is faulty. If the result of step S70 is NO, then the process proceeds to step S72 in which additional wafer-level burn in test is performed. Then, the process proceeds with step S69. The predetermined number of times can arbitrarily be modified by making a change of the relevant portion of the test program by which the CPU of the tester processor 3 is operated.

At step S69, the chip number x is set to 0. At step S73, the chip number x is incremented by 1. In order to search for the chips that are placed out of the monitor test, the tester processor 3 determines, at step S74, whether the flag data NTWLBI(x) is equal to 1. If the flag data NTWLBI(x) is equal to 1, the process proceeds with step S76. If the flag data NTWLBI(x) is not equal to 1, the process proceeds with step S75. At step S76, the chip DUTx is returned to the subject of the monitor test, and the process proceeds with step S75.

At step S75, it is determined whether the chip number x is equal to the maximum number of chips which can simultaneously be subjected to the monitor test. If the answer of step S75 is NO, the process returns to step S73. If it is determined that the chip number x is equal to the maximum number of chips, the process proceeds with step S77, at which the AC test is performed.

For example, as to the chip DUT6 shown in Table 1, the number of faulty bits increases each time the wafer-level burn-in is performed. Hence, the flag data TWLBI(x) is set to 1 at step S53, and the additional wafer-level burn-in is carried out at step S53. In the above test, the additional wafer-level burn-in is performed with respect to the chip in which a faulty bit occurs two or more times due to the wafer-level burn-in performed two times or more.

It is possible to use another method which determines which chip should be subjected to the additional wafer-level burn-in. For example, the additional wafer-level burn-in is carried out with respect to only a chip in which a faulty cell occurs due to the last wafer-level burn-in. By way of another example, the additional wafer-level burn-in is carried out with respect to all chips in which faulty cells occur due to the wafer-level burn-in. The setting of chips to be subjected to the additional wafer-level burn-in can be implemented by modifying the test program.

As described above, the wafer-level burn-in process is divided into parts, and the progress of occurrence of faulty bits is monitored for each chip. The total wafer-level burn-in time of the divided wafer-level burn-in processes can be set to the minimum time necessary to subject the chips to the burn-in. The chips in which there is no increase in the number of faulty bits are no longer subjected to the wafer-level burn-in. The chips which are not degraded by stress applied are subjected to the wafer-level burn-in during the minimum time. The chips in which there is an increase in the number of faulty bits are subjected to the additional wafer-level burn-in, in which additional stress is applied to those chips. Thus, the chips which are liable to be degraded are subjected to the wafer-level burn-in for a sufficient time longer than the minimum time. Hence, it is possible to efficiently perform the wafer-level burn-in as a whole.

Figure 8:
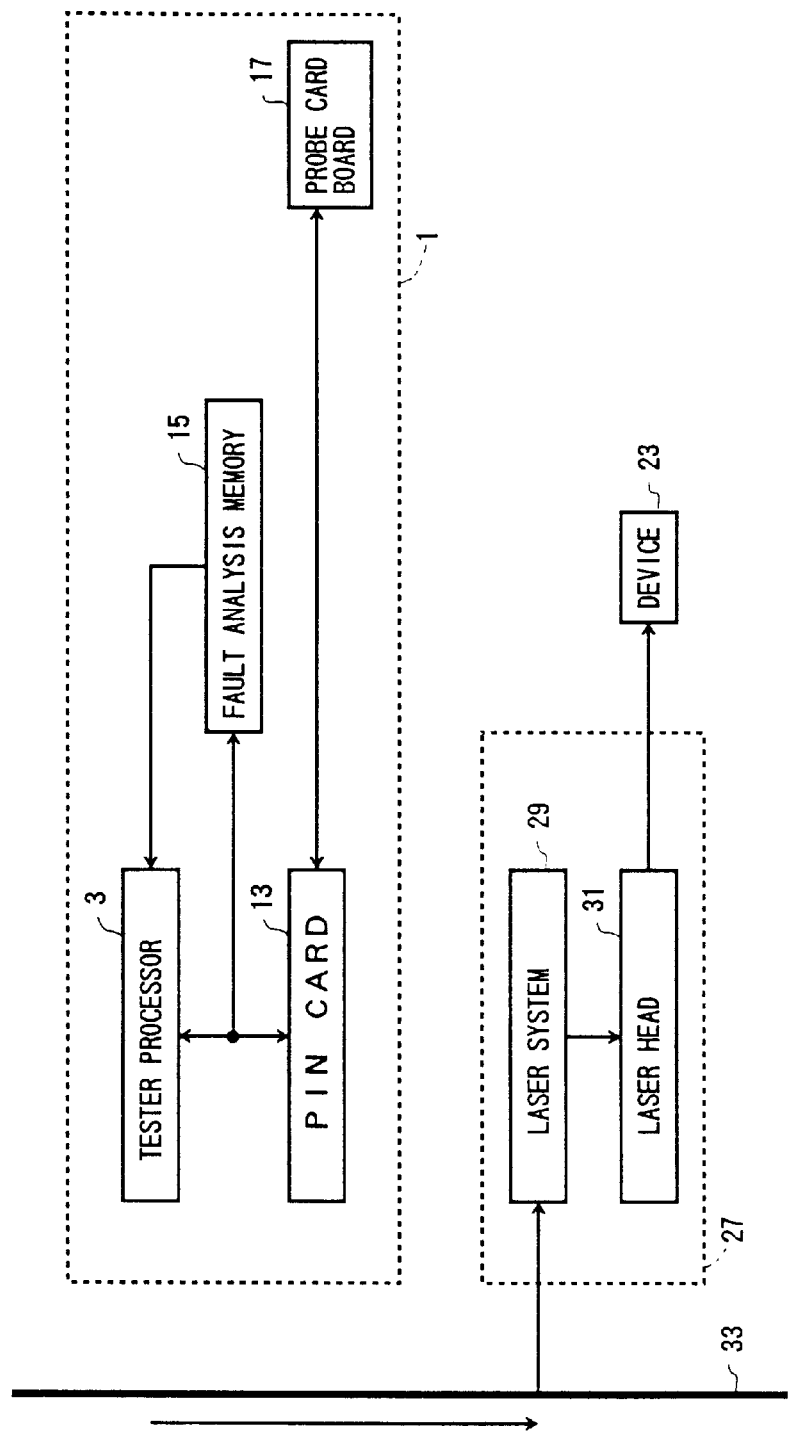
FIG. 8 is a block diagram of a programming system which uses the semiconductor device testing apparatus shown in FIG. 1.

FIG. 8 is a block diagram of a redundant bit programming system using the semiconductor device testing apparatus 1 according to the embodiment of the present invention. The programming system shown in FIG. 8 includes the semiconductor device testing apparatus 1, a data bus 33, and a laser apparatus 27. The data bus 33 is connected to the tester processor 3 of the semiconductor device testing apparatus 1. The laser apparatus 27 connected to the data bus 33 performs a redundant cutting process. The laser apparatus 27 includes a laser system 29 and a laser head 31. The laser system 29 includes a CPU (not shown) and a disk (not shown) connected to the data bus 33. The laser head 31 is connected to the laser system 29.

In the monitor tests performed after the wafer-level burn-in, the address information concerning the faulty bits can be obtained. The address information is filed by the tester processor 3 after the monitor test of FIG. 3 is finished, and is transferred to the laser system 29 via the data bus 33.

The chip which has completely been subjected to the monitor test is loaded to the laser apparatus 27. Then, the laser system 29 dries the laser head 31 on the basis of the file data supplied thereto. The laser head 31 cuts a fuse provided in the chip on the basis of the address information of the file data in order to replace the faulty bit (cell) with another memory cell.

FIG. 9 shows a schematic structure of the device 23. As shown in FIG. 9, the device 23 includes a bit line 41, a word line 37, a redundant bit line 43, a redundant word line 39 and a fuse circuit 35. Symbols FB denote faulty memory cells which occur by the wafer-level burn-in. The bit line 41 and the word line 37 to which faulty memory cells are connected are respectively replaced by the redundant bit line 43 and the redundant word line 39 by the programmed state of the fuse circuit 35. Memory cells are connected to the redundant word line 39 and the redundant bit line 43.

As is known, the fuse circuit 35 includes a plurality of fuses, which can be programmed by cutting by the laser beam from the laser head 31. By programming one or more fuses in accordance with the address information concerning the faulty bits or cells, when the word line 37 and/or the bit line 41 to which the faulty memory cells are connected is addressed, the redundant word line 39 and/or the redundant bit line 43 are automatically selected.

The present invention is not limited to the specifically disclosed embodiments, and variations and modifications may be made without departing from the scope of the present invention.

What is claimed is:

1. A semiconductor device testing apparatus comprising:
    a first part which repeatedly performs a wafer-level burn-in to chips formed on a wafer up to n times, where n is an integer obtained by dividing a total burn-in time into n parts; and
    a second part which detects a change of a number of faulty cells with time in each of the chips.

2. The semiconductor device testing apparatus as claimed in claim 1, further comprising a third part which ends the wafer-level burn-in with respect to a chip when there is no increase in a number of faulty cells in said chip as detected by said second part.

3. The semiconductor device testing apparatus as claimed in claim 2, wherein the first part performs an additional wafer-level burn-in to another chip when there is an increase in a number of faulty cells in said another chip as detected by said second part.

4. The semiconductor device testing apparatus as claimed in claim 3, wherein the first part performs the additional wafer-level burn-in by a predetermined number of times.

5. The semiconductor device testing apparatus as claimed in claim 1, wherein the change in the number of faulty cells in each of the chips is described by a number of faulty cells which occur due to the wafer-level burn-in.

6. The semiconductor device testing apparatus as claimed in claim 1, wherein the change in the number of faulty cells in each of the chips is described by address information concerning the faulty cells.

7. The semiconductor device testing apparatus as claimed in claim 1, wherein the second part includes a part which detects a number of faulty cells in each of the chips each time the first part performs the wafer-level burn-in.

8. The semiconductor device testing apparatus as claimed in claim 1, wherein the first part simultaneously performs the wafer-level burn-in to the chips formed on the wafer.

9. The semiconductor device testing apparatus as claimed in claim 1, wherein the first part performs the wafer-level burn-in by a predetermined number of times.

10. A method of testing a semiconductor device comprising the steps of:
    (a) repeatedly performing a wafer-level burn-in to chips formed on a wafer up to n times, where n is an integer obtained by dividing a total burn-in time into n parts; and (b) detecting a change of a number of faulty cells with time in each of the chips.

11. The method as claimed in claim 10, further comprising the steps of ending the wafer-level burn-in with respect to a chip when there is no increase in a number of faulty cells due to the wafer-level burn-in by referring to the progress of occurrence of the faulty cells in said chip as detected by said step (b).

12. The method as claimed in claim 11, further comprising the step of performing an additional wafer-level burn-in to another chip when there is an increase in a number of faulty cells in said another chip as detected by said step (b).

13. The method as claimed in claim 10, wherein the change in the number of faulty cells in each of the chips is described by a number of faulty cells which occur due to the wafer-level burn-in.

14. The method as claimed in claim 10, wherein the change in the number of faulty cells in each of the chips is described by address information concerning the faulty cells.

15. The method as claimed in claim 10, further comprising the step of detecting a number of faulty cells in each of the chips each time the step (a) performs the wafer-level burn-in.

16. The method as claimed in claim 10, wherein the step (a) simultaneously performs the wafer-level bum in to the chips formed on the wafer.

17. The method as claimed in claim 10, wherein the step (a) performs the wafer-level burn-in by a predeterminded number of times.

18. The method as claimed in claim 10, further comprising the step of replacing the faulty cells with redundant cells.

* * * * *